(12) United States Patent
Wu et al.

(10) Patent No.: US 11,145,380 B1
(45) Date of Patent: Oct. 12, 2021

(54) ANALOG NONVOLATILE MEMORY CELLS USING DOPANT ACTIVATION

(71) Applicant: INTERNATIONAL BUSINESS MACHINES CORPORATION, Armonk, NY (US)

(72) Inventors: Heng Wu, Guilderland, NY (US); Tenko Yamashita, Schenectady, NY (US); Oleg Gluschenkov, Tannersville, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/861,746

(22) Filed: Apr. 29, 2020

(51) Int. Cl.
| | |
|---|---|
| *H01L 29/04* | (2006.01) |
| *H01L 31/036* | (2006.01) |
| *G11C 27/00* | (2006.01) |
| *H01L 45/00* | (2006.01) |
| *G06N 3/08* | (2006.01) |

(52) U.S. Cl.
CPC .......... *G11C 27/005* (2013.01); *H01L 45/065* (2013.01); *H01L 45/126* (2013.01); *H01L 45/1233* (2013.01); *H01L 45/148* (2013.01); *H01L 45/1658* (2013.01); *G06N 3/08* (2013.01)

(58) Field of Classification Search
CPC ...... G11C 27/005; G06N 3/08; H01L 45/065; H01L 45/1233; H01L 45/126; H01L 45/148; H01L 45/1658
USPC ............................................. 365/46; 257/538
See application file for complete search history.

(56) References Cited

U.S. PATENT DOCUMENTS

| | | | |
|---|---|---|---|
| 9,036,400 B2 | 5/2015 | Lu | |
| 9,269,898 B2 | 2/2016 | Maxwell et al. | |
| 9,570,608 B2* | 2/2017 | Ji | H01L 29/66795 |
| 2004/0004267 A1* | 1/2004 | Bunt | H01L 27/101 |
| | | | 257/529 |
| 2011/0284074 A1* | 11/2011 | Liu | H01L 31/0747 |
| | | | 136/258 |
| 2017/0018427 A1* | 1/2017 | Huang | H01L 21/02642 |
| 2017/0053906 A1* | 2/2017 | Or-Bach | H01L 27/11578 |
| 2017/0207214 A1* | 7/2017 | Or-Bach | H01L 27/0694 |

(Continued)

FOREIGN PATENT DOCUMENTS

| | | |
|---|---|---|
| CN | 104051621 A | 9/2014 |
| CN | 110364480 A | 10/2019 |
| WO | WO 2019066854 A1 | 4/2019 |

OTHER PUBLICATIONS

Biswas, S., Doherty, J., Saladukha, D. et al. "Non-equilibrium induction of tin in germanium: towards direct bandgap Ge1-xSnx nanowires." Nat Commun 7, 11405, pp. 1-12, (Apr. 2016). https://doi.org/10.1038/ncomms11405.

(Continued)

*Primary Examiner* — Ly D Pham
(74) *Attorney, Agent, or Firm* — Tutunjian & Bitetto, P.C.; Stosch Sabo (57) ABSTRACT

Memory cells and methods of forming and operating the same include forming a doped crystalline semiconductor memory layer on a first electrode. The doped crystalline semiconductor memory layer has a programmable dopant activation level that determines a resistance of the doped crystalline semiconductor memory layer. A second electrode is formed on the doped crystalline semiconductor memory layer.

15 Claims, 8 Drawing Sheets

(56) References Cited

U.S. PATENT DOCUMENTS

| | | |
|---|---|---|
| 2019/0148286 A1 | 5/2019 | Or-bach et al. |
| 2019/0326294 A1 | 10/2019 | Luan |
| 2020/0335819 A1* | 10/2020 | Collins .................. H01G 4/18 |
| 2020/0335829 A1* | 10/2020 | Collins .............. H01M 10/399 |
| 2021/0125981 A1* | 4/2021 | Or-Bach ............ H01L 23/5226 |

OTHER PUBLICATIONS

IP.Com, "Method and System for Dual Patterning at Tip-To-Side (TS) for Low Contact Resistivity in CMOS", pp. 1-7 (Oct. 2018).

\* cited by examiner

ANALOG NONVOLATILE MEMORY CELLS USING DOPANT ACTIVATION

BACKGROUND

The present invention generally relates to resistive storage elements or memory cells and, more particularly, to memory cells that use dopant activation and deactivation to change a resistive state.

Phase change random access memory (PCRAM) cells use differences between, for example, a crystalline and an amorphous phase within a material to encode and store information. Because the crystalline and amorphous phases can have different resistivities, varying the proportion of the two phases within a memory cell changes the overall resistance of the cell. In such embodiments, the resistance of the PCRAM cell can be adjusted by causing an incremental change in the amount of the PCRAM material that is in one phase, versus another. For example, an initially amorphous material can be progressively crystallized, with the resistance of the total cell changing accordingly.

However, one of the phases of the PCRAM cell will typically be a quasi-stable state. For example, the amorphous state of a material is typically a higher-energy state than the crystalline state. Thermodynamic relaxation from the higher-energy state to the lower-energy state will cause spontaneous shifts in the resistance state over time. Although this change is typically gradual, the resistance drift effect limits the number of different states that can be reliably encoded and, thus, also limits the number of memory states that can be stored in the cell. For instance, to store one bit of information in a single resistive storage element, the resistance drift needs to be less than half of the programmable resistance range but, to store four bits of information, the resistance drift needs to be less than three percent of the programmable resistance range. In some cases, the memory state may need to be refreshed periodically, to prevent resistance drift from changing the stored value but this requires a complicated peripheral circuitry and is not suitable for neuromorphic devices such as a neuromorphic resistive processing unit (RPU).

Neuromorphic resistive processing units (RPUs) employ an array of resistive storage elements or cells that store analog weights or coefficients. These analog weights can be incrementally changed or updated by voltage or current pulses. This provides an analog memory array with in-memory compute function and greatly improves the efficiency of machine learning algorithms. Because resistive storage elements in an RPU store analog weights, the resistance drift needs to be less than 0.1% of the programmable resistance range. Furthermore, an ability to incrementally change these analog weights both up and down would be useful, as a single resistive storage element can serve as a unit cell for RPU array. In some cases, multiple storage elements, along with appropriate circuitry, can be employed within a single RPU unit cell, allowing for incrementally updating stored analog weights in only one direction (e.g. upward).

SUMMARY

A method of forming a memory cell includes forming a doped crystalline semiconductor memory layer on a first electrode. The doped crystalline semiconductor memory layer has a programmable dopant activation level and that determines a resistance of the doped crystalline semiconductor memory layer. A second electrode is formed on the doped crystalline semiconductor memory layer. By using dopant activation to control resistance, the method forms a device that does not change its resistance state through thermodynamic relaxation at an ambient operating temperature.

A memory cell includes a conductive first electrode. A doped crystalline semiconductor memory layer is on the first electrode. The doped crystalline semiconductor memory layer has a programmable dopant activation level that determines a resistance of the doped crystalline semiconductor memory layer. A conductive second electrode is on the doped crystalline semiconductor memory layer. By using dopant activation to control resistance, the device does not change its resistance state through thermodynamic relaxation at an ambient operating temperature.

A method for storing a value in a doped crystalline semiconductor memory cell with a programmable dopant activation level includes applying a first voltage pulse to a doped semiconductor memory cell, to set a resistance of the doped semiconductor memory cell to a low value. The first voltage pulse has a magnitude that activates the dopant within a crystal structure of a base semiconductor material of the doped semiconductor memory cell by integrating the dopant into the crystal structure. A second voltage pulse is applied to the doped semiconductor memory cell, to deactivate dopant within the crystal structure, by causing the dopant to precipitate out of the crystal structure, and to increase the resistance thereby. By controlling dopant activation in a device, the method controls resistance of a memory device that is resistant to changes in resistance from thermodynamic relaxation at an ambient operating temperature.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide memory cells that are based on a doped semiconductor material. Rather than occupying multiple different thermodynamic phases of a base material (e.g. amorphous versus crystalline), the memory cells are kept in a single crystalline phase of semiconducting base material when information is stored. The resistance state of the memory cells is changed by "activating" and "deactivating" dopant in the cells, rather than changing between phases of the base material. As a result, thermodynamic relaxation at an ambient operating temperature does not act to change the resistance state of the memory cell over time.

When the memory cell is set to a first low resistance state, the memory cell temperature can be raised by providing relatively high-voltage, short-duration electrical signals that release electrical power within the memory cell during short periods of time. The dopants present in the cell can be "activated," or placed into substitutional crystal sites of the base material. Such substitutional dopants provide extra electrical free carriers (electrons or holes), thereby lowering the cell resistance. The degree of dopant activation, or the amount of dopants placed into substitutional sites of the base lattice, continuously increases with material temperature, typically peaking at just below the melting point of base material. Accordingly, if the cell temperature is quickly raised to just below the base material melting point, and then quickly quenched, some dopants present in the material are locked into substitutional lattice sites, reducing resistance of the cell.

The maximum concentration of substitutional dopants, and the corresponding first low resistance state, relates to the maximum solid solubility or, equivalently, the solid solubility limit of a particular dopant in a particular base material. Solid solubility is a measure of how much dopant can be homogeneously placed within a base solid material at a given temperature in thermodynamic equilibrium. Because the dopant can be placed both substitutionally and interstitially into a base lattice, the maximum dopant activation level is a fraction of the solid solubility limit, for example one quarter of this limit.

Accordingly, the memory cell can be set to a first low resistance state by activating dopants with localized high-temperature pulses, induced by relatively high-voltage short-duration electrical signals. Temperature localization for setting individual cells can be achieved by providing electrical signals shorter than 500 ns and preferably shorter than 50 ns. The efficiency of dopant activation or, equivalently, a degree at which the resultant amount of substitutional dopants approaches the dopant solid solubility at a given temperature can be improved by applying multiple short-duration electrical signals that result in a plurality of sub-melt temperature pulses. The first low resistance state of memory cell is limited by the solid solubility limit and the efficiency of dopant activation. The memory cell can then stably store the value by maintaining a constant resistance indefinitely.

The dopant may be present in concentrations that exceed a solid solubility limit. In this case, the memory cell can be reset to a second low resistance state, which is lower than the first low resistance state, by melting cell base material together with dopant. The memory cell temperature is raised above the base material melting point by providing relatively high-voltage short-duration electrical signals that release electrical power within the memory cell during short periods of time. Once the base material is melted, the dopant quickly and evenly redistributes throughout the molten material. Liquified base material is able to dissolve dopant well above the solid solubility limit, and the dopant can diffuse within the liquid during nanosecond-scale temperature pulses. This dissolves dopant precipitates or clusters that may have been formed in prior cell programming steps. The memory cell is then cooled in a manner that crystallizes the base material and locks the excess dopant into its crystalline structure, rather than being allowed to precipitate out.

Accordingly, the memory cell can be reset to the second low resistance state by activating dopants in excess of the solid solubility limit, with base crystal re-growth induced by localized high-temperature pulses. Temperature localization for resetting individual cells can be achieved by providing electrical signals shorter than about 500 ns, and preferably shorter than about 50 ns. The efficiency of dopant dissolution in a liquid state can be improved by applying multiple short-duration electrical signals, which result in a series of temperature pulses, each melting and recrystallizing cell base material. Once the cell resistance is reset to its lowest value, the memory cell can then stably store the value by maintaining a constant resistance indefinitely.

During operation, the resistance state of the memory cell can then be adjusted upward by providing relatively low-voltage signals, which allows the dopant atoms to leave substitutional sites within the crystal structure and to bind together. As the dopant precipitates out of the crystal lattice, it stops contributing to the conductivity of the semiconductor material, thereby increasing the resistance state of the memory cell.

This phenomenon is referred to herein as dopant deactivation. The rate of dopant deactivation depends on the starting level of activation and the base material temperature. Higher levels of dopant activation result in a higher deactivation rate, but base material temperatures in excess of 400° C. are needed to initiate any significant deactivation rate. The memory cell temperature may be raised above 400° C., but kept well below the base melting point, by providing relatively low-voltage electrical signals that release electrical power within the memory cell. To induce an appreciable dopant deactivation, the cell base material needs to be kept at the selected intermediate temperature for a prolong period of time. Long-duration electrical signals may result in heating adjacent cells and changing their resistance state simultaneously.

For programming individual cells, electrical signals may be shorter than about 500 ns, and preferably shorter than about 50 ns. A cumulative prolonged exposure at a selected intermediate temperature is achieved by applying multiple short-duration electrical signals that result in respective temperature pulses, each raising cell base material temperature to the selected intermediate temperature.

Once the cell resistance is adjusted upward, the memory cell can then stably store the value by maintaining a constant resistance indefinitely, because the operating cell temperature for storing and reading information can be kept below 100° C., resulting in no change in dopant activation/deactivation. Once the cell resistance is adjusted upward above the first low resistance state, the cell resistance can then be adjusted incrementally downward by sub-melt temperature pulses as described above. The present embodiments thereby provide memory cells with programmable resistance states that do not suffer from resistance drift, due to operation in the crystalline phase.

Figure 1:
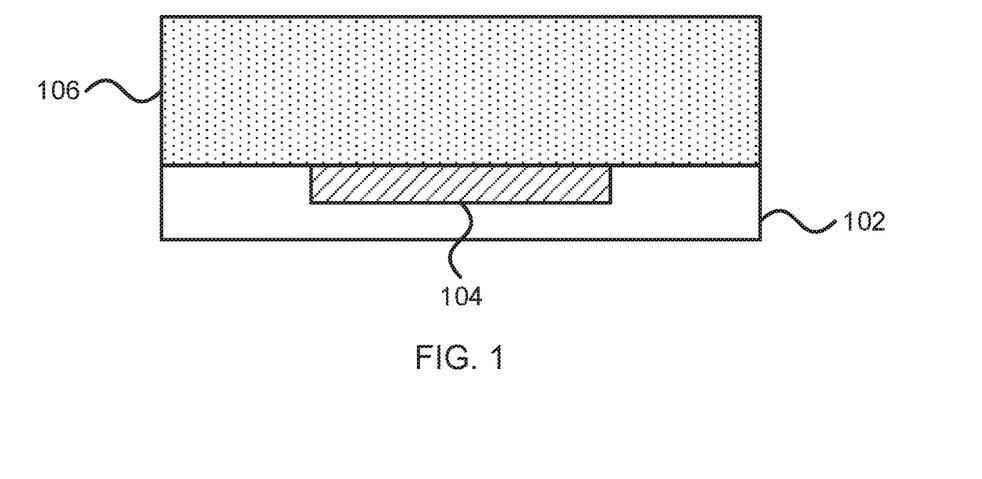
FIG. 1 is a cross-sectional view of a step in the formation of a resistive memory cell that uses dopant activation to program a resistance state, in accordance with an embodiment of the present invention.

Referring now to the drawings in which like numerals represent the same or similar elements and initially to FIG. 1, a cross-sectional view is shown of a step in the fabrication of a memory cell that uses dopant activation and deactivation to set a resistance state. A bottom electrode 104 is formed in a semiconductor substrate 102. An interlayer dielectric 106 is formed over the bottom electrode.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. The semiconductor substrate 102 can also be the surface of a front-end-of-line structure.

The bottom electrode 104 may be formed from any appropriate conductive metal such as, e.g., tungsten, nickel, titanium, molybdenum, tantalum, copper, platinum, silver, gold, ruthenium, iridium, rhenium, rhodium, cobalt, and alloys thereof. The bottom electrode may alternatively be formed from a doped semiconductor material such as, e.g., doped polysilicon. The bottom electrode may include features that have the effect of reducing its thermal conductance, thereby helping to confine heat within memory cell. Such features may include conductive interfaces within the bottom electrode, having a relatively low thermal boundary conductance.

The crystal structure of the bottom electrode 104 can be selected to provide nucleation sites of a particular crystalline phase of a semiconductor material of a memory cell, for example by templating the semiconducting crystal. This can be accomplished by selecting crystalline phases for the bottom electrode 104 to be of the same type/symmetry as those of crystalline semiconductor (e.g. cubic-to-cubic phase or hexagonal-to-hexagonal phase), and selecting lattice spacing of the bottom electrode material to be similar to those of a crystalline semiconducting material of the cell.

The interlayer dielectric 106 may be formed from any appropriate electrically insulating material and may be formed on the surface of the semiconductor substrate 102 by any appropriate deposition process. In some embodiments, the interlayer dielectric 106 may be formed from silicon dioxide or a low-k dielectric material, to reduce parasitic capacitances. As used herein, "low-k" refers to a material with a dielectric constant k that is lower than the dielectric constant of silicon dioxide. The interlayer dielectric 106 may have a low thermal conductivity and diffusivity for confining heat within the memory cell. Silicon dioxide or porous silicon dioxide can be used, and feature both a low thermal diffusivity and conductivity and a low dielectric constant.

Figure 2:
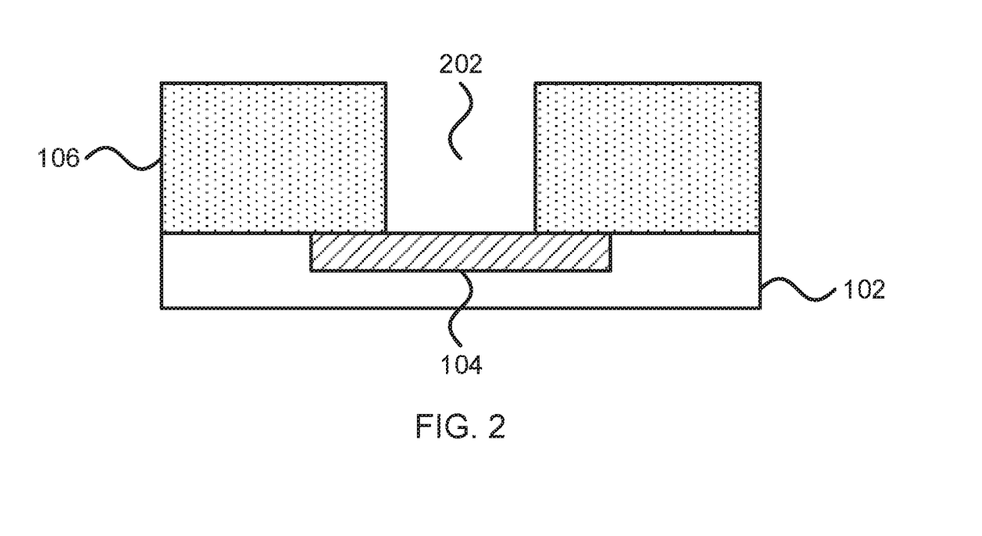
FIG. 2 is a cross-sectional view of a step in the formation of a resistive memory cell that uses dopant activation to program a resistance state, in accordance with an embodiment of the present invention.

Referring now to FIG. 2, a cross-sectional view is shown of a step in the fabrication of a memory cell that uses dopant activation and deactivation to set a resistance state. A hole 202 is formed in the interlayer dielectric layer 106. The hole 202 may be formed by any appropriate process, for example by forming a photolithographic mask that exposes the hole region, followed by an anisotropic etch that selectively removes the exposed dielectric material, without damaging the underlying electrode 104.

For example, reactive ion etching (RIE) is a form of anisotropic plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. As used herein, the term "selective" in reference to a material removal process denotes that the rate of material removal for a first material is greater than the rate of removal for at least another material of the structure to which the material removal process is being applied.

Figure 3:
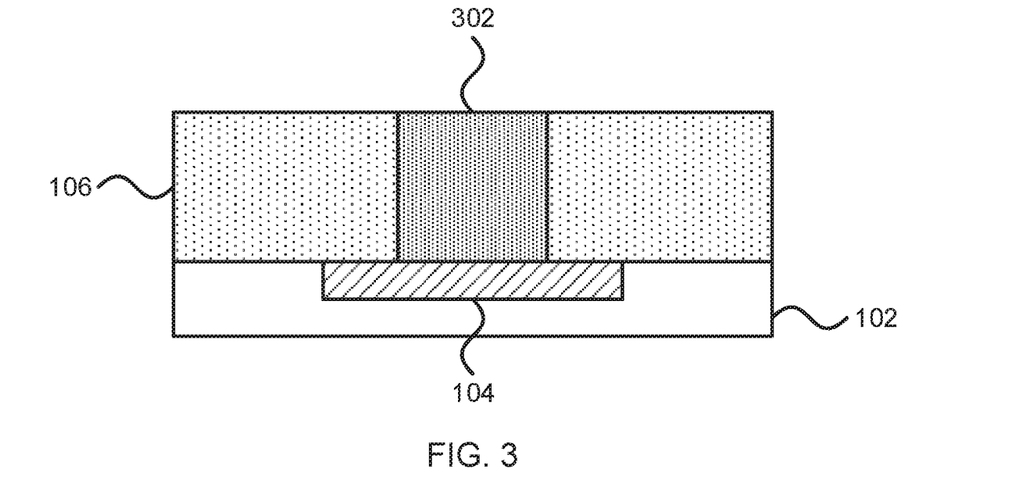
FIG. 3 is a cross-sectional view of a step in the formation of a resistive memory cell that uses dopant activation to program a resistance state, in accordance with an embodiment of the present invention.

Referring now to FIG. 3, a cross-sectional view is shown of a step in the fabrication of a memory cell that uses dopant activation and deactivation to set a resistance state. A doped semiconductor memory cell 302 is formed in the hole 202 by any appropriate deposition process, such as chemical vapor deposition (CVD), physical vapor deposition (PVD), atomic layer deposition (ALD), or gas cluster ion beam (GCIB) deposition, followed by a chemical mechanical planarization (CMP) process to remove excess material from the top of the interlayer dielectric 106.

CMP is performed using, e.g., a chemical or granular slurry and mechanical force to gradually remove upper layers of the device. The slurry may be formulated to be unable to dissolve, for example, the interlayer dielectric material, resulting in the CMP process's inability to proceed any farther than that layer.

The material of the doped semiconductor memory cell 302 is selected to have a low melting point to ease programming cell resistance states. It should be noted that the material of the bottom electrode 104 is selected to be insoluble in the semiconductor material. It should be understood that any appropriate semiconductor material can be used, but germanium, with its melting point of about 940° C., is specifically contemplated, particularly when mixed with tin. Incorporating tin in germanium to form GeSn improves the properties of the material for the purposes of the present embodiments by, e.g., i) reducing the melting temperature of GeSn alloy, which can be as low as 875° C.; ii) increasing lattice vacancy and self-interstitial atom generation; iii) increasing diffusivity for dopants; and iv) speeding-up segregation of tin and dopants into electrically-inactive and scattering-inducing precipitates and clusters. The tin content inside GeSn may be below 30% to avoid transition to the metallic phase. GeSn is inherently a metastable alloy, allowing for rapid activation-deactivation dopant cycles. In the event that GeSn is used, then the conductive material of the bottom electrode 104 may be, for example, tungsten, rhodium, or ruthenium.

The interface between metallic bottom electrode 104 and the doped semiconducting material of a cell may include another layer of doped semiconducting material, with a substantially higher melting point than that of base material 302. In the case of Ge or GeSn, such an additional layer of doped semiconducting material may include doped silicon Si, with a melting point of about 1412° C., or doped silicon germanium, with a melting point that may varying from about 1412° C. to about 940° C., depending on Ge content. This semiconducting material does not melt during a reset operation and provides good lattice templating for nucleating crystalline semiconductor from liquid, and provides a stable low resistance contact between metallic electrode 104 and the cell semiconducting doped material 302. An interfacial metallic compound (e.g. silicide or germanosilicide) may be formed at the interface between metallic electrode 104 and adjacent semiconducting material.

Although GeSn is specifically contemplated as the base material of the doped semiconductor memory cell 302, other exemplary materials include group III-V and group II-VI semiconducting materials with a low melting point, such as group III-V antimonides (e.g., InSb, with a melting point of 527° C.) or group II-VI tellurides (e.g., $Hg_xCd_{1-x}Te$, with $x \leq 0.9$ and a melting point of 700-1000° C.).

The doped semiconductor memory cell 302 includes one or more dopants, which may be added to the doped semiconductor memory cell 302 in situ during formation or may, alternatively, be added by subsequent ion implantation. Exemplary dopants can be either n-type or p-type. Exemplary dopants include phosphorus and arsenic for n-type Group IV semiconductors, and boron, aluminum, or gallium for p-type Group IV Semiconductor, but it should be understood that any appropriate dopant may be used instead. Group III-V antimonides and group II-VI tellurides may have a different set of dopants.

The selected dopant should feature a high rate of deactivation, which is the ability to exit substitutional lattice sites and to stop contributing free electrons or holes to electrical conduction. High rate of deactivation can be with dopants that have a relatively high maximum solid solubility in the base semiconducting material, for example about 1 atomic percent (at. %) or higher or, equivalently, $5 \times 10^{20}$ cm$^{-3}$ or higher. For Ge or GeSn semiconducting materials, high solubility dopants include phosphorus and arsenic for n-type, and aluminum and gallium for p-type.

The dopant may also feature high diffusivity during thermal anneals and self-heating during device operation. The doped semiconductor memory cell 302 can operate with a wide range of doping concentration, for example from $1 \times 10^{19}$ cm$^{-3}$ to $1 \times 10^{22}$ cm$^{-3}$, or, equivalently, from 0.02 at. % to 20 at. %. Higher doping concentration of from $5 \times 10^{20}$ cm$^{-3}$ to $1 \times 10^{22}$ cm$^{-3}$, or, equivalently, from 1 at. % to 20 at. % may be preferred due to an increased rate of deactivation. Advantageously, the dopant is added to a concentration that exceeds its solid solubility limit in the base semiconductor material, increasing the rate of dopant deactivation and precipitation during resistance programming.

Figure 4:
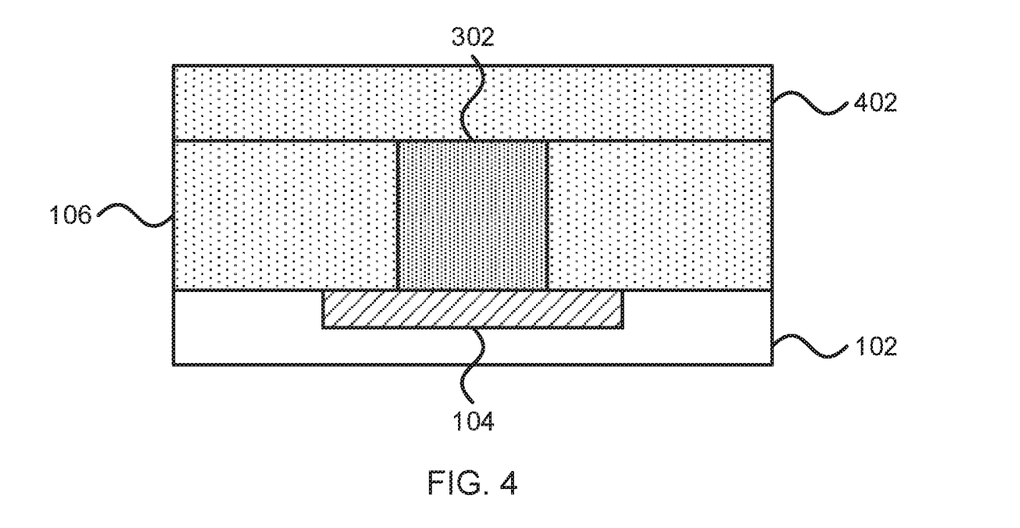
FIG. 4 is a cross-sectional view of a step in the formation of a resistive memory cell that uses dopant activation to program a resistance state, in accordance with an embodiment of the present invention.

Referring now to FIG. 4, a cross-sectional view is shown of a step in the fabrication of a memory cell that uses dopant activation and deactivation to set a resistance state. An additional interlayer dielectric 402 is deposited over the memory cell 302. The additional interlayer dielectric 402 can be formed from any appropriate dielectric material, but it is specifically contemplated that the material may be made from a material having low thermal conductivity, such as silicon dioxide. The additional interlayer dielectric 402 can be formed by any appropriate process, including CVD, ALD, PVD, GCIB deposition, etc. The additional interlayer dielectric 402 can be formed from the same material as the interlayer dielectric 106, or from a different material. The interlayer dielectric 402 can have a low thermal conductance for confining heat within the memory cell. The low thermal conductance may be achieved by selecting a material of interlayer dielectric 402 with low thermal conductivity and diffusivity, or by making interlayer dielectric 402 relatively thin.

Figure 5:
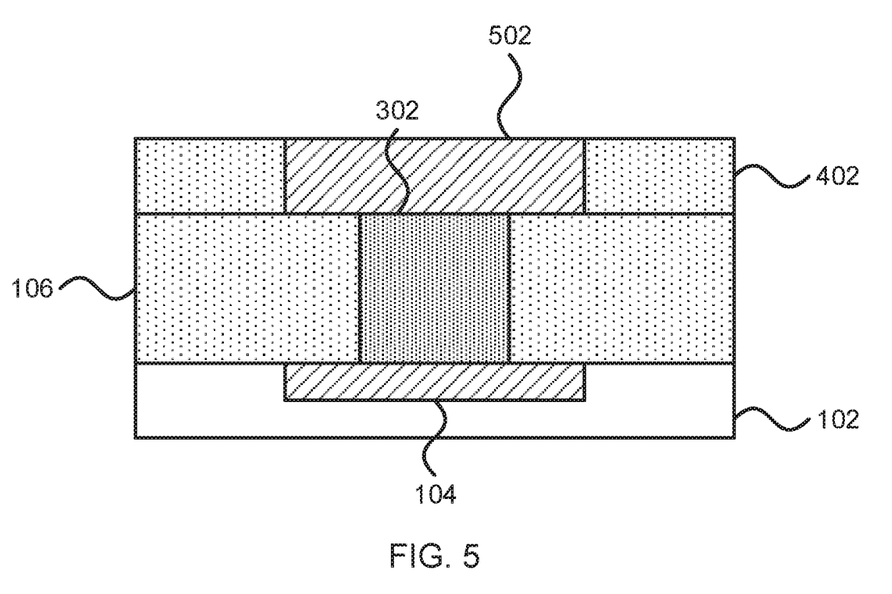
FIG. 5 is a cross-sectional view of a step in the formation of a resistive memory cell that uses dopant activation to program a resistance state, in accordance with an embodiment of the present invention.

Referring now to FIG. 5, a cross-sectional view is shown of a step in the fabrication of a memory cell that uses dopant activation and deactivation to set a resistance state. A hole is patterned and etched into the additional interlayer dielectric 402, above the memory cell 302, and a top electrode 502 is formed therein. A conductive material can be deposited in the hole, by any appropriate deposition process, and then polished down to the level of the additional interlayer dielectric 402 using a CMP process.

As noted above, the conductive material for the top electrode 502 can be any appropriate conductor that is not soluble in the material of the memory cell 302. In particular, tungsten, rhodium, and ruthenium are contemplated, as they do not dissolve in molten GeSn at the operational temperatures of the memory cell. The interface between metallic top electrode 502 and the doped semiconducting material of cell may include another layer of doped semiconducting material, having a substantially higher melting point than that of base material 302. In the case of Ge or GeSn, such an additional layer of doped semiconducting material may include doped silicon, with melting point of about 1412° C., or doped silicon germanium, with melting point varying from 1412° C. to 940° C., depending on Ge content. This higher melting point semiconducting material does not melt during a reset operation and provides a stable, low-resistance contact between metallic electrode 502 and the cell base semiconducting material.

An interfacial metallic compound (e.g. silicide or germanosilicide) may be formed at the interface between metallic electrode 502 and adjacent semiconducting material. The top electrode may also include features that are directed to reducing its thermal conductance, thereby helping to confine heat within the memory cell. Such features may be conductive interfaces within the top electrode with a relative low thermal boundary conductance.

The resistance of the entire cell depicted in FIG. 5 includes at least four distinct components: the resistance of the top and bottom electrodes, the resistance of connecting wires (not shown), the resistance of bulk base material, and the interfacial or contact resistance between electrodes and base material. The combined resistance of wires and electrodes can be made small compared to the combined bulk and contact resistances of the base material. This can be achieved by adjusting the geometry of the cell element 302. Making hole 202 smaller, and making interlayer dielectric 106 thicker, increases the aspect ratio of cell element 302, and decreasing contact area between 302 and electrodes results in an increased bulk and contact resistance of base material 302. A preferred range of combined bulk and contact resistances of the base material is from 1 kΩ to 100 MΩ, with the exact number depending on chosen doping level of material 302 and its geometry. Both bulk and contact resistances of the base material may depend on its dopant activation level, and can therefore be programmable. At least three types of programmable resistance cells are specifically contemplated, including by changing bulk base resistance only, by changing both bulk and interfacial resistance, and by changing interfacial resistance only.

It is to be understood that the memory cell structure depicted in FIG. 5 can be a part of a larger memory unit, device, or architecture that may include cross-point cell architecture, synaptic cell architecture, multi-bit memory cell architecture, cell access devices, row or column select devices, sense amplifiers, and other memory-related devices. Specifically, the memory cell structure depicted in FIG. 5 may be a part of a multi-bit nonvolatile random access memory or a neuromorphic resistive processing unit. While the memory cell structure depicted in FIG. 5 is referred herein as a memory cell, it can be also viewed as a basic resistive storage element for enabling more complex memory unit cells.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "an" "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms ended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 6:
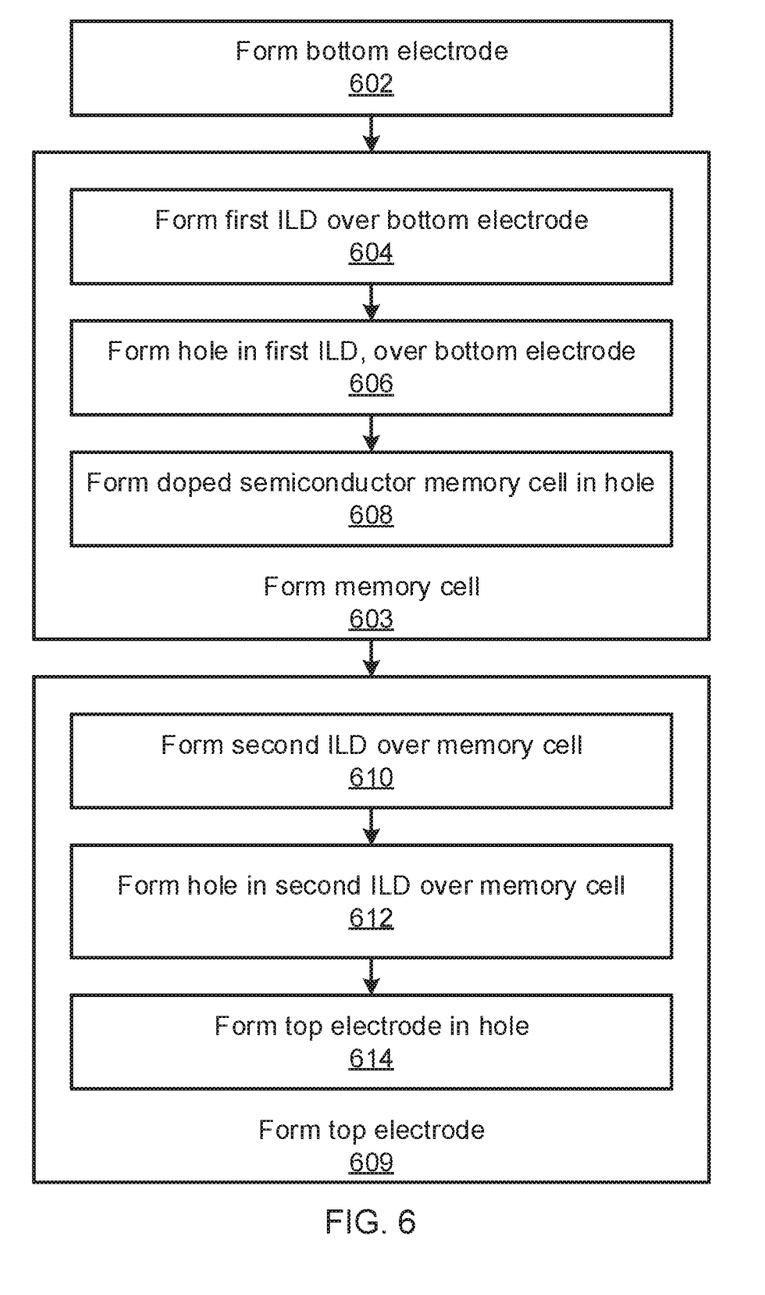
FIG. 6 is a block/flow diagram of a method of forming a memory device that uses dopant activation to program a resistance state, in accordance with an embodiment of the present invention.

Referring now to FIG. 6, a method of fabricating a resistive memory cell is shown. Block 602 forms a bottom electrode 104 on a substrate 102. As noted above, the bottom electrode 104 is formed from a material that is selected for its compatibility with (e.g., its insolubility in) the material of the memory cell. For memory cells formed from germanium or GeSn, it is specifically contemplated that the bottom electrode 104 may be formed from tungsten, rhodium, or ruthenium.

It is specifically contemplated that the bottom electrode 104 can be formed as part of a back-end-of-line layer, in electrical communication with one or more other circuit components that are formed in or on the substrate 102 during front-end-of-line processing sequence. In other embodiments, however, electrical contact can be made to the bottom electrode 104 by any appropriate path of conductive interconnects and vias, for example in a front-end-of-line or middle-of-line processing sequence. The bottom electrode 104 may be formed by sequentially depositing different conducting materials thereby incorporating conductive interfaces with relatively low thermal boundary conductance to maintain the efficiency of self-heating in the memory cell.

Block 603 shows the process for forming the memory cell 302. Block 604 forms first interlayer dielectric 106 on the substrate layer 102 and the bottom electrode 604 using any appropriate deposition process. The first interlayer dielectric 106 can be formed from a material having low thermal conductivity and diffusivity, to maintain the efficiency of self-heating in the memory cell. Block 606 then forms a hole 202 in the first interlayer dielectric 106 using any appropriate masking process, followed by a selective anisotropic etch that does not damage the underlying bottom electrode 104.

Block 608 forms the doped semiconductor memory cells 302 in the hole 202. The memory cell 302 can be formed by any appropriate deposition process, conducted at temperatures compatible with back-end-of-line processing, and may include in situ doping or may include doping by ion implantation. The base material of the memory cell 302 is selected to have a low melting point, while the dopant material is selected to have a high solid solubility in the base material. The base material of the memory cell 302 may include different material compositions, with different melting points, deposited sequentially. In some embodiments, material directly adjacent to bottom electrodes 104 can have a higher melting point, such that it does not melt during reset operation. In embodiments where germanium or GeSn is used for the base material, the dopant may include, for example, arsenic and phosphorous for n-type dopants, or gallium and aluminum for p-type dopants. The dopant may be added with a concentration that exceeds the solid solubility limit. After deposition of the base material, excess material can be removed using a CMP process that stops on the first interlayer dielectric 106.

Block 609 shows a process for forming a top electrode. Block 610 forms a second interlayer dielectric 402 over the memory cell 302, by any appropriate deposition process. The second interlayer dielectric 406 can be formed from a material having low thermal conductivity and diffusivity, to maintain the efficiency of self-heating in the memory cell. Block 612 forms a hole in the second interlayer dielectric 402, over the memory cell 302, by any appropriate masking process, followed by an appropriate anisotropic etch. It should be understood that the etch that forms the hole in the second interlayer dielectric 402 can be selective, but the etch should also be timed, or should be set to stop when the memory cell 302 is exposed, to prevent overetching around the memory cell 302. In some embodiments, this can be accomplished by using RIE end point detection with plasma emission spectroscopy.

Block 614 then forms a top electrode 502 in the hole in the second interlayer dielectric 402. In some embodiments, prior to forming top electrode 502, the composition of exposed material 302 may be modified via a selective deposition process to form a surface layer only on exposed material 302. The selectively deposited material may have a higher melting point, such that it does not melt during reset operation. The top electrode 502, similar to the bottom electrode 104, is formed from a conductive material that will not dissolve in the molten base material of the memory cell 302 during a reset operation. The top electrode 502 may be formed by sequentially depositing different conducting materials, thereby incorporating conductive interfaces with relatively low thermal boundary conductance, to maintain the efficiency of self-heating in the memory cell.

Figure 7:
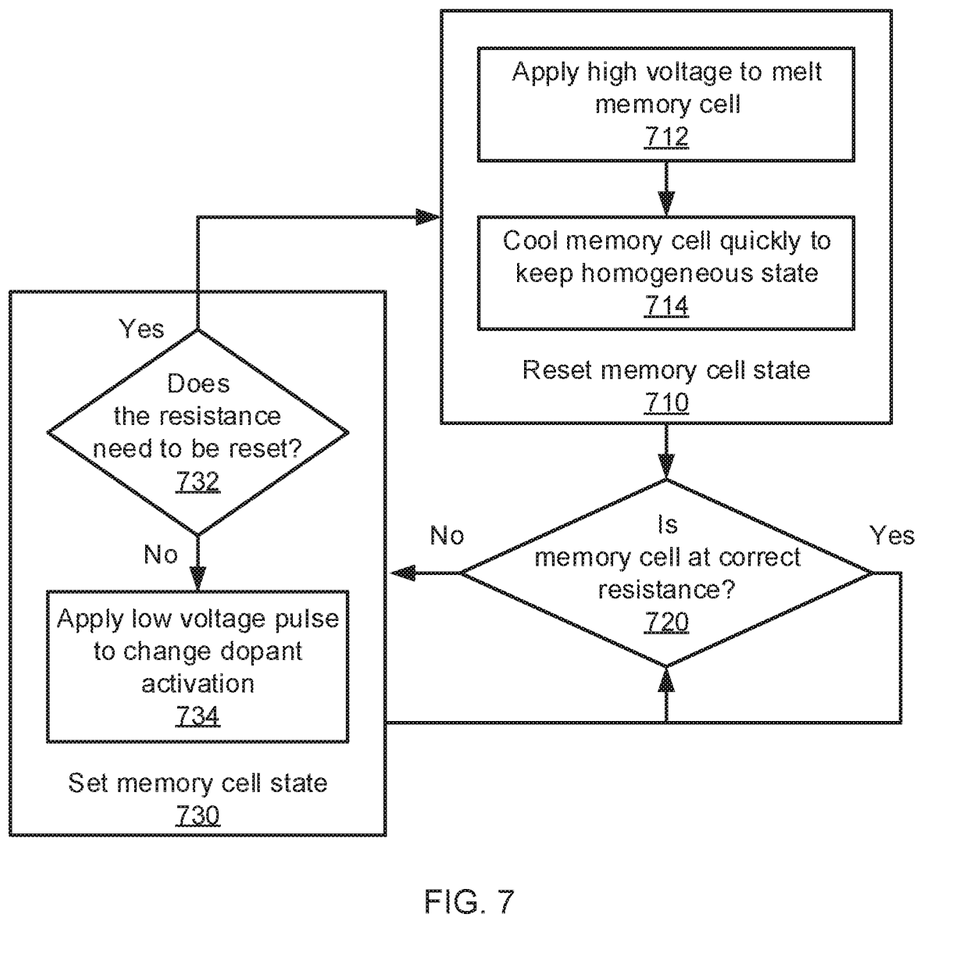
FIG. 7 is a block/flow diagram of a method of setting a resistance value of a memory device that uses dopant activation to program a resistance state, in accordance with an embodiment of the present invention.

Referring now to FIG. 7, a method for setting a resistance state of an activated-dopant semiconductor memory cell 302 is shown. The resistance state of the memory cell 302 can range between two different extremes, with one extreme being determined by a physical state where the dopant is homogeneously distributed through the crystalline structure of the base material and activated (known as an "activated" state), and with the other extreme being determined by a physical state where the dopant is precipitated out of the crystalline structure (known as a "deactivated" state). From the fully activated state, the memory cell 302 can be incrementally changed toward the deactivated state by applying voltage pulses that causes corresponding current pulses and, thereby, localized heating raising cell temperature above 400° C., but below the melting point. The heating allows the dopants to fall out of substitutional lattice sites and to move within the crystal lattice of the base material and to aggregate. When a sufficiently high voltage is applied, the temperature of the memory cell rises above a melting point, and deactivated dopants are dissolved in the liquid phase and activated during the crystal re-growth process, locking the dopant atoms into the lattice sites.

By allowing the base material to cool quickly, the activated dopant cannot precipitate out, despite being above the solid solubility limit. When the amount of activated dopant fall below about a quarter of its maximum solid solubility, the memory cell 302 can be incrementally changed toward the activated state by applying voltage pulses that causes localized heating raising cell temperature close but below the melting point.

During operation, then, block 710 functions to reset the state of the memory cell 302. Block 712 applies a high voltage, for a short period of time, which melts the memory cell 302, and creates a homogeneous liquid mixture of the base material and the dopant. Block 714 then cools the material to reform the memory cell 302, in a fully activated state. This state represents the lowest resistance state of the memory cell 302, as the activated dopant contributes its charge carriers in the lattice.

Block 720 determines whether the memory cell 302 is at the desired resistance, based on a particular memory architecture and function. In the context of neuromorphic devices, the memory cell 302 stores analog weights or coefficients, and the blocks 720/730 represent an update function for the stored coefficients based on a neuromorphic algorithm, e.g., based on the divergence between the measured output signal and the desired output signal. In the context of a multi-bit digital storage, the full range of the memory cell's possible resistances can be divided into sub-ranges, each representing a distinct stored memory value. Thus, if the range is divided into sixteen distinct resistance sub-ranges, then the memory cell 302 can store four bits of information. Block 720 determines whether the present resistance of the memory cell 302 falls within the resistance sub-range that corresponds to a value that is to be stored. If not, processing proceed to block 730, which changes the memory cell state. If the value is already correct, block 720 waits until, for example, a new value is to be written to the memory cell 302.

Setting the memory cell state in block 730 can include incremental changes to the resistance, or can include a complete reset of the memory cell state. Because the incremental changes can decrease the resistance of the memory cell only in the limited range of low initial activation level, and because the incremental changes can increase the resistance of the memory cell through deactivation mechanism over a wide range of initial activation level, a reduction in resistance may necessitate a reset in the memory cell state. Block 732 makes the this determination, and triggers block 710 if the resistance needs to be drastically reduced. If not, block 734 applies a relatively low-voltage pulses, as described in greater detail below. After each increment, block 720 determines whether the memory cell has reached the correct resistance. If not, block 730 provides a further increment.

Figure 8:
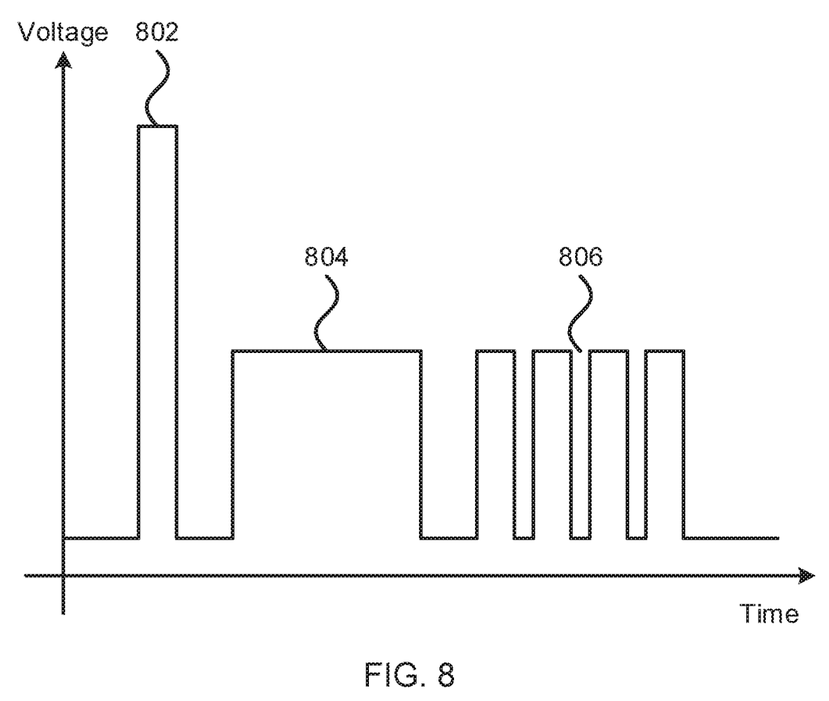
FIG. 8 is a diagram that illustrates different pulse lengths and magnitudes that may be used to set the resistance value of a memory device that uses dopant activation to program a resistance state, in accordance with an embodiment of the present invention.

Referring now to FIG. 8, a variety of different voltage pulses are shown, to describe their respective effects on the memory cell 302. A first voltage pulse 802 can be provided, as described above with respect to block 710, to reset the resistance state of the memory cell 302. The voltage level is high enough, and hence the current across the memory cell 302 is high enough, to heat the memory cell 302 above its melting point. In the case of a memory cell 302 that is formed from doped GeSn, the temperature may be above 875° C.

It should be appreciated that the peak voltage level that causes cell material 302 melting is a function of cell geometry, its resistance, thermal properties of cell and surrounding materials, and pulse duration. While these parameters may be selected to keep this voltage level between 5V and 1V, the exact voltage level at which material 302 begins to melt can be determined experimentally during memory device initialization. Once determined, other voltage levels can be expressed in relative percentages referenced to this level. The duration of the first voltage pulse 802 is kept short. As a result, the total heated volume of the memory cell 302 and the surrounding material is kept small, allowing the memory cell 302 to resolidify quickly after the first voltage pulse 802 ends.

Shortness of the voltage pulse also plays a role in enabling temperature localization, and reducing temperature cross-talk, between adjacent cells, leading to denser memories. Temperature localization for resetting individual cells can be achieved by providing electrical signals shorter than about 500 ns, and preferably shorter than about 50 ns, for example between about 20 ns and about 40 ns.

The first voltage pulse 802 is made long enough, however, to allow for liquid material re-crystallization, and to permit the dopant sufficient time to dissolve dopant in liquid phase and diffuse it throughout the base liquid material. Voltage pulses that are shorter than several nanoseconds may quench liquified base material into an undesirable amorphous phase and, hence, are avoided. The presence of an efficient crystal lattice templating during material solidification, by either bottom electrode lattice or semiconductor material that remained solid, can be used to prevent solidification into amorphous phase with relatively long pulses of tens of nanoseconds. If a single short-duration voltage pulse is not sufficient to dissolve and diffuse dopants in base liquid material, the efficiency of dopant dissolution can be improved by applying multiple short-duration voltage pulses that result in respective temperature pulses, each melting and recrystallizing cell base material.

A second voltage pulse 804 can be provided, as described above with respect to block 730, to cause an incremental change to the resistance of the memory cell 302. The voltage is set to a level that heats the memory cell to above about 400° C., but still below the melting point of the memory cell 302. A long pulse width is shown, allowing the dopant atoms time to leave the crystal lattice of the memory cell 302, with a longer pulse corresponding to more dopant deactivation, and thus a proportionally greater increase in the resistance. The second voltage pulse 804 may thus be several milliseconds long, and can be timed according to the amount of change needed.

However, as a result of long pulse duration, the total heated volume of the memory cell 302 and its surrounding material becomes large, potentially affecting adjacent memory cells and changing their resistance state simultaneously. It should be appreciated that the peak voltage level for the second pulse 804 is a function of the duration of the second pulse 804, among other parameters specified in conjunction to selecting voltage level for pulse 802. Due to a different pulse duration, the melt-based voltage calibration for pulse 804 may be repeated during the initialization of a memory device.

Once the melt threshold voltage for pulse 804 is obtained, the operating voltage for pulse 804 may be set about 10% to about 50% below the melt threshold voltage. However, the practical range for operating voltages may still be kept between 5V and 1V. The duration of pulse 804 may also be limited by the material damage (e.g. the interconnect damage) at temperatures in excess of 400° C. for prolonged periods of time, e.g. in excess of millisecond.

For programming individual memory cells, as described above with respect to block 730, a set of voltage pulses 806 are applied to the memory cell 302. Each of the set of voltage pulses 806 is set to incrementally change the resistance of the memory cell 302. The use of multiple pulses 806 reduces the amount of heat that is lost to the surrounding material, enabling temperature localization and reducing temperature cross-talk between adjacent cells that leads to denser memories. Temperature localization for programming individual cells can be achieved by providing electrical signals shorter than about 500 ns, and preferably shorter than about 50 ns, for example between about 20 ns and about 40 ns. In some embodiments, the duration of individual pulse 806 can be the same as that of pulse 802.

Thus, rather than conducting one millisecond-scale pulse, the set of smaller voltage pulses 806 can include, for example, 10,000 pulses that are each 100 ns in length to achieve a desired level of dopant deactivation. Thus, cumulative duration of the pulses 806 of about, for example, between 1 millisecond and 1000 seconds, individual pulses have a duration between about 10 ns about 1 µs, and a number of pulses between about 1,000 to about 1,000,000,000 distinct pulses, are contemplated, though it should be understood that other values can be used instead. The melt-based voltage calibration for individual pulse 806 is conducted during the memory device initialization, as described for calibrating pulses 802 and 804. Once the melt threshold voltage for an individual pulse 806 is obtained, the operating voltage for individual pulse 806 can be about 5% to about 50% below the melt threshold voltage. The practical range for operating voltages can still kept between about 5V and about 1V.

A set of pulses 806 can be used to adjust the resistance of individual memory cells upward and, in limited cases, downward. Applying a set of pulses 806 to a highly activated material 302 with the active dopant level at or above maximum solid solubility, such as after a reset operation, adjusts the individual cell resistance incrementally upward. This has an advantage of incrementally adjusting cell resistance with fewer number of 806 pulses, yielding quick programming individual cells. However, the incremental adjustments can only be made upward.

A number of neuromorphic and memory devices can utilize this mode of programming. However, such devices may need multiple resistive cells 302 and additional transistors for a single memory unit. Applying a set of pulses 806 to a weakly activated material 302, with the active dopant level at or below a quarter of maximum solid solubility, typically after a prolonged deactivation operation, can adjust the individual cell resistance incrementally downward, if the voltage level of individual pulse is relatively high and 5-20% below the melt voltage threshold. At the same time, applying a set of pulses 806 to the same weakly activated material 302 can adjust the individual cell resistance incrementally upward, if the voltage level of individual pulse is relatively low, and 30-50% below the melt voltage threshold.

Hence, the individual cell resistance can be adjusted symmetrically up and down within a limited resistance range and at the expense of adjustment speed or required number of 806 pulses. Specifically, inducing additional deactivation cycle in this regime (adjusting resistance further upward), with voltage pulses 806 at 30-50% below the melt voltage threshold, may have a cumulative duration in excess of seconds, while inducing sub-melt activation cycle in this regime (adjusting resistance further downward) with voltage pulses 806 between about 5% and about 20% below the melt voltage threshold may have a cumulative duration in excess of hundreds of microseconds.

Despite slow programming, the ability to symmetrically and incrementally adjust cell resistance is beneficial for certain neuromorphic devices, because such devices can employ a single resistive cell 302 as a synaptic unit that stores and updates analog weights or coefficients. If the memory cell 302 is to be used in devices that employ such symmetric resistance programming in a weakly activated material, the doping level of base material 302 can be kept intentionally low, from about $5 \times 10^{19}$ cm$^{-3}$ to about $5 \times 10^{20}$ cm$^{-3}$, or, equivalently, from 0.1 at. % to 1 at. %, to avoid a highly activated state after a reset operation.

Figure 9:
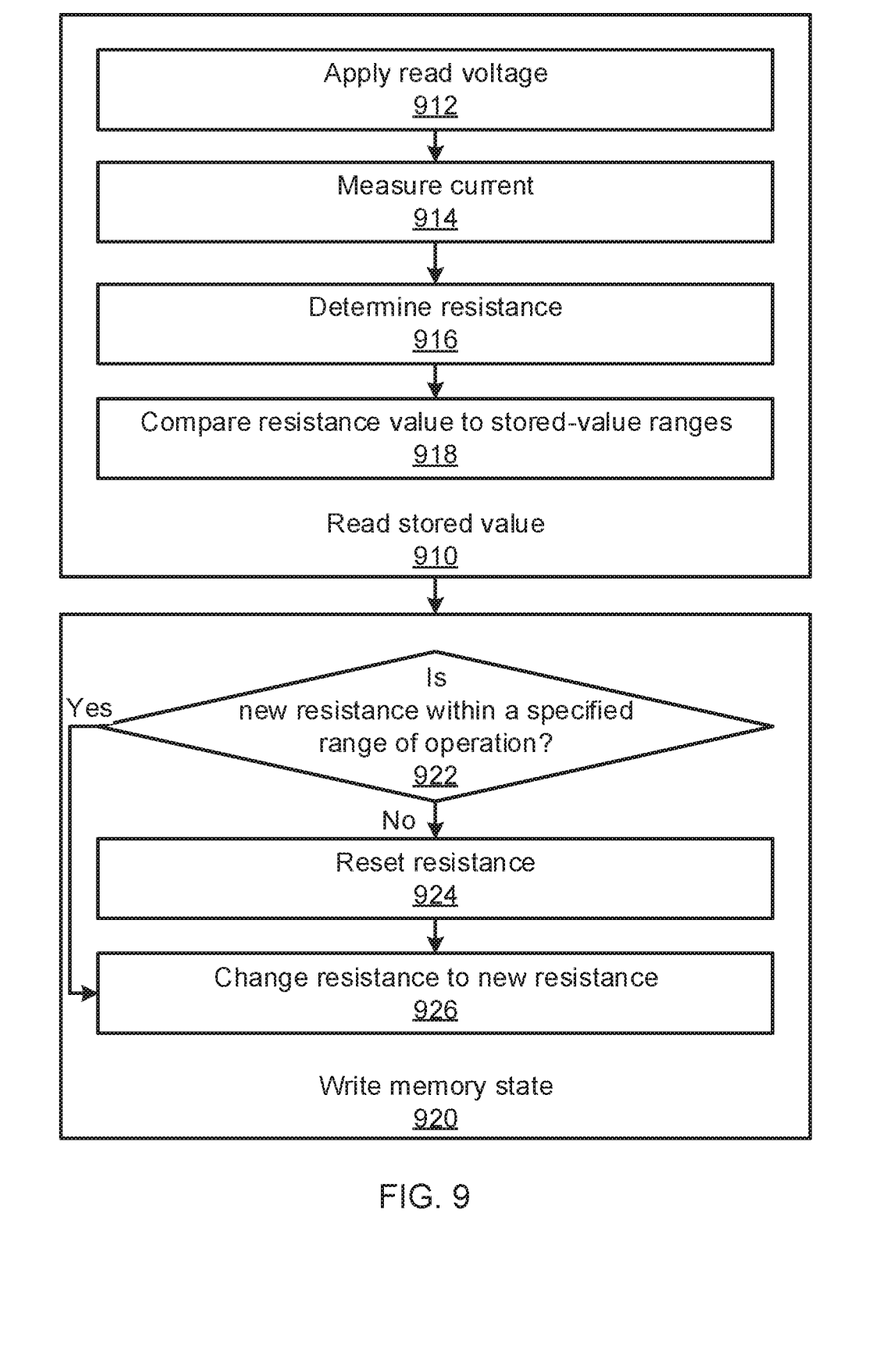
FIG. 9 is a block/flow diagram of a method for operating a memory device that uses dopant activation to program a resistance state, in accordance with an embodiment of the present invention.

Referring now to FIG. 9, a method of operating a memory cell 302 is shown. Block 910 reads the stored value in the memory cell 302 and block 920 writes a new value to the memory cell 302. To read a stored value, block 912 applies a read voltage across the memory cell. The read voltage is set at a magnitude that is lower than the write voltages described above in FIG. 8, at a level that will not heat the memory cell 302 to such a degree that dopant is deactivated. In some embodiments, the read voltage may be at least 90% lower than the melt voltage threshold at similar duration, and does not cause self-heating of individual cells in excess of 80° C. Block 914 then measures the current that is output by the memory cell 302.

Block 916 determines the resistance of the memory cell 302, based on the applied voltage and the measured current, using Ohm's law. In the context of neuromorphic devices with stored analog weights, for example, the determined resistance value can be directly used in underlying algorithms. In the context of digital devices, Block 918 then compares the resistance value to a set of predetermined state resistance ranges and values based on a particular digital memory architecture and function. In the context of a multi-bit digital storage, for example, in a memory cell that has a resistance range that is divided into sixteen sub-ranges, any of sixteen different stored values are possible. Block 918 thus determines which of the sub-ranges the memory cell 302 occupies, which corresponds to a predetermined number of stored bits.

When writing a new value to the memory cell 302, block 922 determines whether the new resistance value, that corresponds to the new stored value, is within a specified range of operation, and if a set pulses 804/806 can bring it to the desired state. If not, block 924 resets the resistance, as described above.

Figure 10:
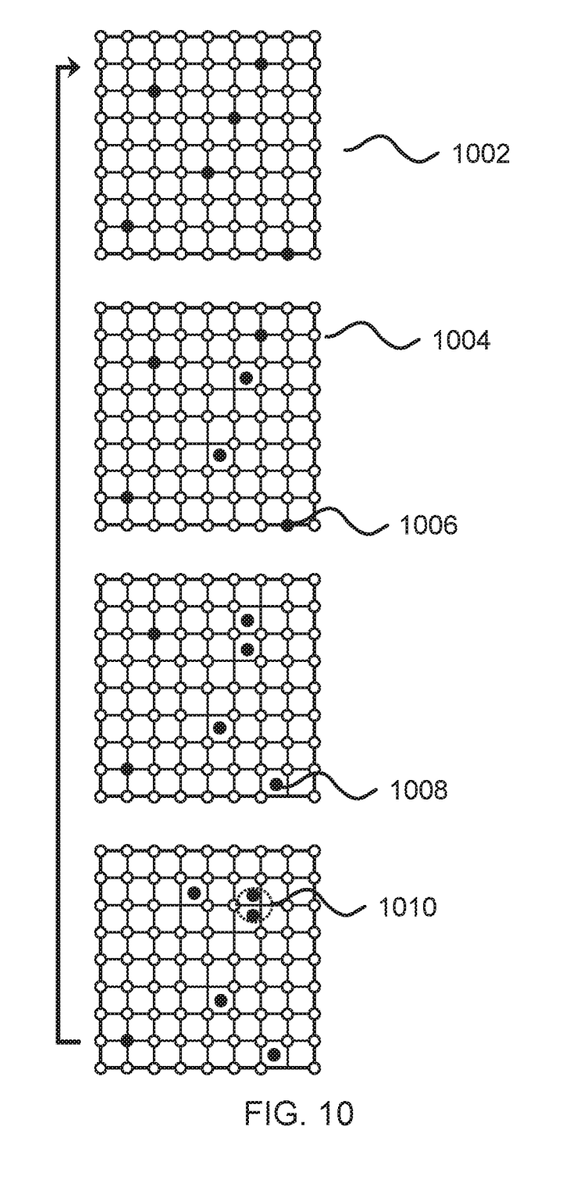
FIG. 10 is a diagram showing a difference between a material with activated dopants and a material with deactivated dopants, in accordance with an embodiment of the present invention.

Referring now to FIG. 10, a diagram shows a crystal lattice structure 1002 that includes atoms of a base material 1004, with activated atoms dopant material 1006 taking substitutional places in the lattice structure 1002. As the dopant material is deactivated, individual dopant atoms 1008 drop out of the lattice structure 1002. When this occurs, the contribution of those atoms to the resistance of the cell changes. As further incremental deactivations are applied, additional dopant atoms drop out, and may accrete to form clusters 1010. When the resistance of the cell is reset, the deactivated dopant atoms 1008 reintegrate with the crystal lattice, and become activated dopant atoms 1004 again.

Having described preferred embodiments of memory cells using dopant activation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a memory cell, comprising:
    forming a doped crystalline semiconductor memory layer on a first electrode, the doped crystalline semiconductor memory layer having a programmable dopant activation level that determines a resistance of the doped crystalline semiconductor memory layer; and
    forming a second electrode on the doped crystalline semiconductor memory layer.

2. The method of claim 1, wherein a base semiconductor material of the doped crystalline semiconductor memory layer comprises germanium.

3. The method of claim 2, wherein a base semiconductor material of the doped crystalline semiconductor memory layer is GeSn.

4. The method of claim 2, wherein the dopant is selected from the group consisting of arsenic, phosphorous, aluminum, and gallium.

5. The method of claim 1, further comprising forming the first and second electrodes from a conductive material that is not soluble in a base semiconductor material of the doped crystalline semiconductor memory layer when the base semiconductor material is molten.

6. The method of claim 5, wherein the conductive material is selected from the group consisting of tungsten, rhodium, and ruthenium.

7. The method of claim 1, further comprising forming the first and second electrodes with a crystalline phase that matches a crystalline phase of a base semiconductor material of the doped crystalline semiconductor memory layer.

8. A memory cell, comprising:
a conductive first electrode;
a doped crystalline semiconductor memory layer on the first electrode, having a programmable dopant activation level that determines a resistance of the doped crystalline semiconductor memory layer; and
a conductive second electrode on the doped crystalline semiconductor memory layer.

9. The memory cell of claim 8, wherein a base semiconductor material of the doped crystalline semiconductor memory layer comprises germanium.

10. The memory cell of claim 9, wherein the base semiconductor material is GeSn.

11. The memory cell of claim 9, wherein the dopant is selected from the group consisting of arsenic, phosphorous, aluminum, and gallium.

12. The memory cell of claim 8, wherein the first and second electrodes comprise a conductive material that is not soluble in a base semiconductor material of the doped crystalline semiconductor memory layer when the base semiconductor material is molten.

13. The memory cell of claim 12, wherein the conductive material is selected from the group consisting of tungsten, rhodium, and ruthenium.

14. The memory cell of claim 8, wherein the first and second electrodes have a crystalline phase that matches a crystalline phase of a base semiconductor material of the doped crystalline semiconductor memory layer.

15. The memory cell of claim 8, wherein the doped crystalline semiconductor memory layer has a dopant concentration that exceeds a solid solubility limit of a base semiconductor material of the doped crystalline memory layer.

* * * * *